United States Patent
Wimplinger et al.

(10) Patent No.: US 8,449,716 B2
(45) Date of Patent: May 28, 2013

(54) DEVICE AND METHOD FOR SEPARATING A SUBSTRATE FROM A CARRIER SUBSTRATE

(75) Inventors: Markus Wimplinger, Ried im Innkreis (AT); Friedrich Paul Lindner, Schärding (AT)

(73) Assignee: EV Group GmbH, St. Florian (AT)

( * ) Notice: Subject to any disclaimer, the term of this patent is extended or adjusted under 35 U.S.C. 154(b) by 0 days.

(21) Appl. No.: 13/265,035

(22) PCT Filed: Mar. 31, 2010

(86) PCT No.: PCT/EP2010/002054
§ 371 (c)(1),
(2), (4) Date: Oct. 18, 2011

(87) PCT Pub. No.: WO2010/121703
PCT Pub. Date: Oct. 28, 2010

(65) Prior Publication Data
US 2012/0241098 A1    Sep. 27, 2012

(30) Foreign Application Priority Data

Apr. 21, 2009   (DE) .................. 10 2009 018 156

(51) Int. Cl.
*B32B 38/00*    (2006.01)

(52) U.S. Cl.
USPC ........................................ 156/718; 156/763

(58) Field of Classification Search
USPC ................................................ 156/718, 763
See application file for complete search history.

(56) References Cited

U.S. PATENT DOCUMENTS

| | | | | |
|---|---|---|---|---|
| 5,091,042 | A | * | 2/1992 | Bruckner ....................... 156/763 |
| 5,269,868 | A | * | 12/1993 | Gofuku et al. ................ 156/718 |
| 5,282,918 | A | * | 2/1994 | Heist et al. .................... 156/765 |
| 5,423,931 | A | * | 6/1995 | Inoue et al. ...................... 156/94 |
| 5,466,325 | A | * | 11/1995 | Mizuno et al. ................ 156/701 |
| 5,800,665 | A | * | 9/1998 | Okaniwa et al. ............. 156/701 |
| 6,068,727 | A | * | 5/2000 | Weaver et al. ................ 156/701 |
| 6,227,276 | B1 | * | 5/2001 | Kim et al. ..................... 156/763 |
| 7,150,804 | B2 | * | 12/2006 | Tajima .......................... 156/718 |
| 8,211,270 | B2 | * | 7/2012 | Suzuki et al. ................. 156/718 |
| 2003/0041960 | A1 | * | 3/2003 | Sasada .......................... 156/247 |

(Continued)

FOREIGN PATENT DOCUMENTS

| | | |
|---|---|---|
| JP | 7-169723 | 7/1995 |
| JP | 2004-63645 | 2/2004 |
| JP | 10 2006 031 434 A1 | 1/2008 |
| JP | 2008-192982 | 8/2008 |
| WO | WO 2008/088560 | 7/2008 |

OTHER PUBLICATIONS

International Search Report for International Application No. PCT/EP2010/002054, Jun. 18, 2010.

*Primary Examiner* — Mark A Osele
*Assistant Examiner* — Nickolas Harm
(74) *Attorney, Agent, or Firm* — Kusner & Jaffe

(57) ABSTRACT

Device for separating a substrate from a carrier substrate which is connected to the substrate by an interconnect layer. The device includes a carrier substrate holder with a holding surface for holding the carrier substrate, and a substrate holder which is located opposite the carrier substrate holder with a substrate holding surface which can be located parallel to the holding surface for accommodating the substrate. There are separating means for parallel displacement of the substrate relative to the carrier substrate in the interconnected state of the substrate and carrier substrate.

7 Claims, 2 Drawing Sheets

U.S. PATENT DOCUMENTS

| | | | |
|---|---|---|---|
| 2004/0050489 A1* | 3/2004 | Ohwada et al. | 156/344 |
| 2008/0008565 A1 | 1/2008 | Thallner | 414/217.1 |
| 2008/0245483 A1* | 10/2008 | Toyoshima et al. | 156/584 |
| 2009/0065144 A1* | 3/2009 | Yamamoto et al. | 156/344 |

* cited by examiner

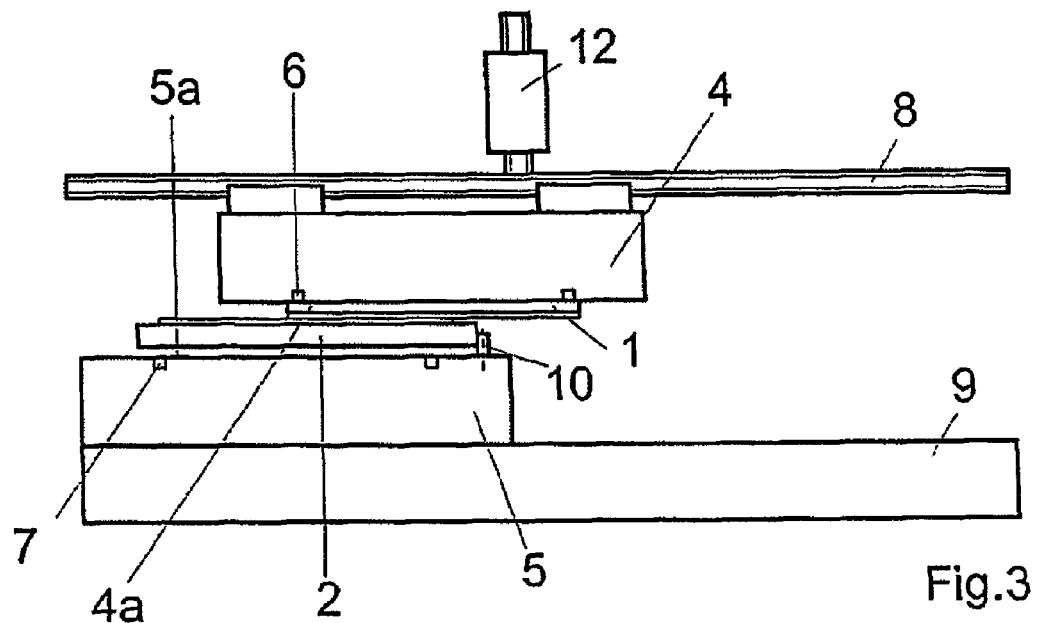
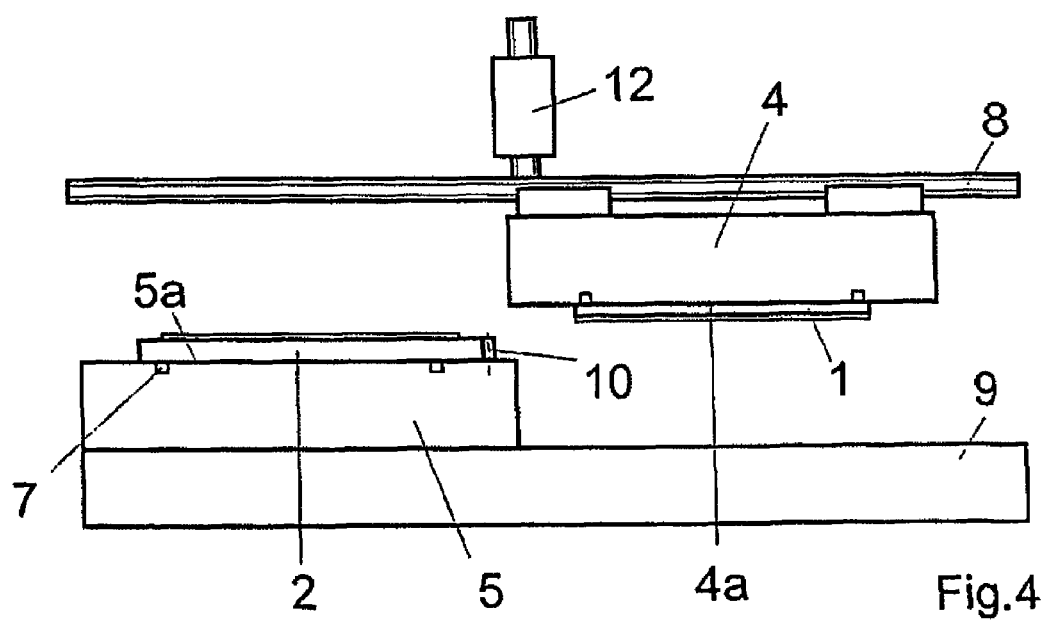

DEVICE AND METHOD FOR SEPARATING A SUBSTRATE FROM A CARRIER SUBSTRATE

FIELD OF THE INVENTION

The invention relates to a device and a method for separating a substrate from a carrier substrate which is connected to the substrate by an interconnect layer.

BACKGROUND OF THE INVENTION

Substrates in the semiconductor industry are wafer-shaped round or rectangular bodies, which are often thinned, fragile, for example arched, or subject to pretensioning, with a very small thickness of generally less than 300 µm.

Depending on the carrier materials used and the interconnect layer used between the carrier and the wafer, different processes for dissolving or destroying the interconnect layer are known, such as for example the use of UV-light, laser beams, temperature action or solvents.

Separation increasingly constitutes one of the most critical process steps since the substrates with substrate thicknesses of a few µm easy break during stripping/peeling or are damaged by the forces which are necessary for the stripping process.

Moreover thin substrates have hardly any stability of shape or none at all and typically curl without support material. During handling of the re-thinned wafer therefore fixing and support of the wafer are essentially indispensable.

In existing methods and devices the separation of the substrate from the carrier substrate takes place either by lifting off or by rolling off, with the disadvantage that generally considerable forces are acting on the sensitive substrate.

SUMMARY OF THE INVENTION

Therefore the object of this invention is to devise a device and a method for detaching a substrate as easily as possible from a carrier in a nondestructive manner.

This object is achieved with the features of the independent claim(s). Advantageous developments of the invention are given in the dependent claims. The framework of the invention also encompasses all combinations of at least two of the features given in the specification, the claims, and/or the figures. In the specified value ranges, values which lie within the indicated limits will also be disclosed as boundary values and they are to be claimed in any combination.

The invention is based on the idea of devising a device and a method for separating a substrate from a carrier substrate which is connected to the substrate by an interconnect layer, and in which separation of the substrate takes place by parallel displacement of the substrate and carrier substrate against one another. It is advantageous here if during the predominant separation process forces act more or less exclusively parallel to a substrate holding surface of the substrate holder which accommodates the substrate. Furthermore it is advantageous if the carrier substrate is separated from the substrate while the carrier substrate is being spaced apart from the carrier substrate holder for accommodating the carrier substrate or is being lifted off the holder. In this case, in the transverse direction, for parallel displacement of the carrier substrate to the substrate ideally only the force of gravity is acting on the carrier substrate. In particular compressive forces from the carrier substrate do not act in the direction of the substrate.

The configuration as claimed in the invention essentially precludes canting of the substrate with the carrier substrate, especially when separation takes place by the action of a force on the periphery of the carrier substrate.

In one advantageous configuration of the device as claimed in the invention, it is provided that there are means for reducing the connecting force caused by the interconnect layer. The interconnect layer can be a cement which can be provided as a thermoplastic or wax in a thickness from 0.01 µm to 500 µm between the substrate and the carrier substrate. The cement is at least partially liquefied by heating or UV irradiation or another known method in order to minimize the adhesive force which is counteracting the separation of the substrate and carrier substrate by the cement. The reduction of the connecting force takes place advantageously before separation of the substrate from the carrier substrate.

In another advantageous configuration of the invention, the separating means comprise a guide carriage which can be driven especially by a linear drive for parallel displacement of the substrate relative to the carrier substrate. The parallel displacement as relative motion can take place by movement of the substrate with the carrier substrate fixed or by movement of the carrier substrate with the substrate fixed or by movement of the carrier substrate and the substrate. A configuration is especially advantageous in which the substrate remains fixed on the substrate holding surface of the substrate holder and is displaced parallel relative to the laterally fixed carrier substrate. In this way the substrate can be protected against breaking specifically during the separation process by the substrate holding surface.

In another advantageous configuration of the invention it is provided that the separation means comprise raising means for raising the substrate which is connected to the carrier substrate, especially by raising the guide carriage. By raising the substrate-carrier substrate combination which consists of the carrier substrate, the interconnect layer and the substrate, separation of the substrate from the carrier substrate can take place when the carrier substrate is floating so that aside from the force of gravity acting on the carrier substrate itself, no other forces acting transversely to parallel displacement are acting on the carrier substrate.

By the carrier substrate holder comprising carrier substrate fixing means for fixing the carrier substrate on the holding surface and/or the substrate holder comprising substrate fixing means for fixing the substrate on the substrate holding surface, both the substrate and also the carrier substrate can be fixed most easily directly to the carrier substrate holder or substrate holder. Advantageously, fixing takes place by applying a negative pressure or vacuum to part of the contact surface of the substrate or carrier substrate with the substrate holder or the carrier substrate holder.

To the extent the separating means comprise, especially exclusively, holding means which act against parallel displacement, especially stops attached to the carrier substrate holder or the substrate holder, a force which counteracts the parallel displacement for separating the substrate from the carrier substrate can be applied extremely easily to the carrier substrate or the substrate. The force acts in this way solely on the side or the periphery of the substrate or carrier substrate so that transverse forces are not produced by the holding means.

According to one special aspect of the invention it is provided that the linear drive is assigned a drive control with which the speed of parallel displacement can be controlled by the guide carriage 8. It is especially advantageous here to measure the stripping force for control of the speed with dynamometric means since the stripping force is dependent among others on the contact area between the substrate and carrier substrate which changes during the stripping process. To measure the force, dynamometer cells can be used as the dynamometric means or the power consumption of the linear drive can be measured. A velocity which increases according to certain stipulations from the start of stripping to the end of the stripping process, without the influence of dynamometric means, is less complex.

Advantageously stripping takes place at a constant stripping force. The speed of parallel displacement is accordingly indirectly proportional to the active contact area between the substrate and the carrier substrate.

The method as claimed in the invention for separating the substrate from a carrier substrate which is connected to the substrate by an interconnect layer in its most general form has the following steps.

Holding a substrate-carrier substrate combination which consists of the carrier substrate, the interconnect layer and the substrate between the substrate holding surface of a substrate holder and the holding surface of a carrier substrate holder, which latter surface can be located parallel to the substrate holding surface, Separating the substrate from the carrier substrate by parallel displacement of the substrate relative to the carrier substrate in the interconnected state of the substrate and the carrier substrate.

In one advantageous configuration of the invention, a connecting force which is caused by the interconnect layer is reduced after holding and before separation. In this way the force necessary for separation becomes smaller and damage to the substrate or carrier substrate is prevented.

In one advantageous embodiment of the method as claimed in the invention separation takes place by a guide carriage which can be driven especially by a linear drive for parallel displacement of the substrate relative to the carrier substrate. Especially exact parallel displacement can be implemented on the guide carriage.

According to another advantageous configuration of the invention, it is provided that before separation the substrate-carrier substrate combination is raised after the fixing of the carrier substrate on the carrier substrate holder has been optionally cancelled. The carrier substrate can then be separated from the substrate in a freely floating manner.

In another advantageous embodiment of the invention, it is provided that the separation of the substrate from the carrier substrate takes place at least predominantly solely by parallel displacement. At the start of the separation process which proceeds by parallel displacement the contact area between the substrate and the carrier substrate is largest, so that at the start of the separation process the separation force which is necessary for separation is greatest and it continuously decreases up to complete separation of the substrate from the carrier substrate. In this respect, after at least predominant separation of the substrate from the carrier substrate an additional force component can also be applied transversely to parallel displacement.

BRIEF DESCRIPTION OF THE DRAWINGS

Other advantages, features and details of the invention will become apparent from the following description of preferred embodiments and using the drawings.

FIG. 3 shows a schematic side view of the device as claimed in the invention in a third process step and FIG. 4 shows a schematic side view of the device as claimed in the invention in a fourth process step.

DETAILED DESCRIPTION OF PREFERRED EMBODIMENT

Figure 1:
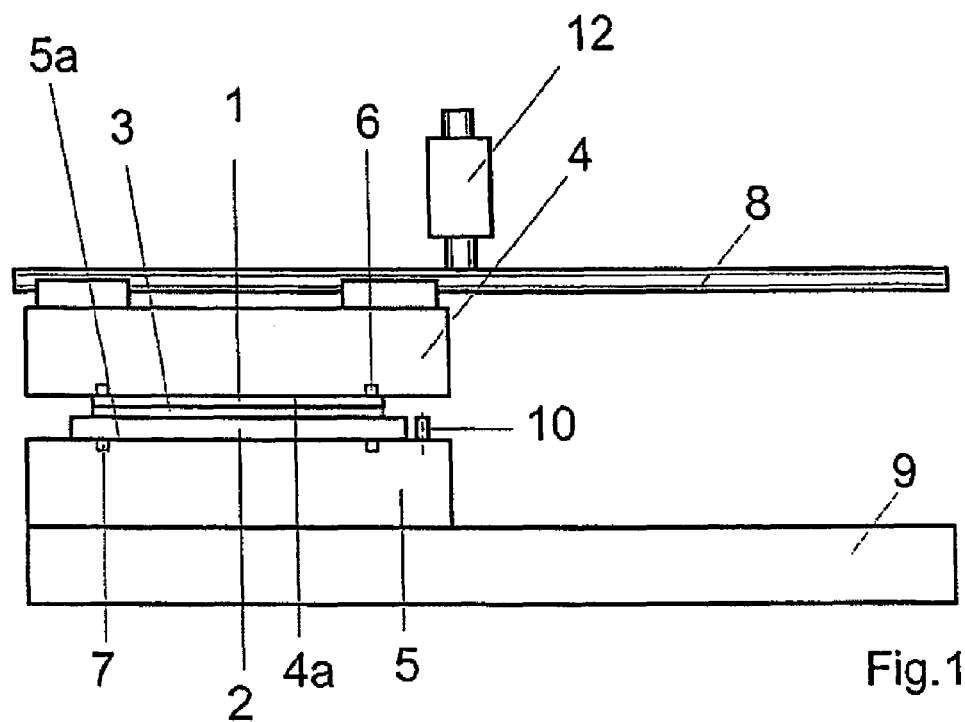
FIG. 1 shows a schematic side view of the device as claimed in the invention in a first process step.

In the figures the same components and components with the same function are identified with the same reference numbers.

The device shown in FIGS. 1 to 4 consists of a stable base plate 9 which vibrates as little as possible. Above the base plate 9 there are the other components of the device which are mechanically connected especially to the base plate 9; this is not shown in the schematic.

A carrier substrate holder 5 rests on the base plate 9; it is made as a chuck and with its side facing away from the base plate 9 it is used as a holding surface 5a for holding the carrier substrate 2.

The carrier substrate 2 can be fixed by carrier substrate fixing means 7 which are formed in the embodiment as vacuum grooves on the holding surface 5a and thus on the carrier substrate holder 5.

Fixing can be controlled by the corresponding control means.

Laterally next to the holding surface 5a which is intended for accommodating the carrier substrate 2, on the carrier substrate holder 5 there are holding means 10 which can be made pluggable. Thus, replacement of the holding means 10 for carrier substrates 2 of different thickness is possible and the holding means can be adapted to the size of the carrier substrate 2. By providing several plug positions on the periphery of the carrier substrate 2 different forms and sizes of the carrier substrate can be implemented.

Opposite the base plate 9 or the carrier holder 5 a guide carriage 8 with a linear drive which is not shown is located parallel to the holding surface 5a. On the guide carriage 8 a substrate holder 4 with a substrate holding surface 4a for accommodating a substrate 1 is mounted to be able to move parallel to the holding surface 5a.

The substrate 1 can be fixed by substrate fixing means 6, here vacuum grooves, in the conventional manner on the substrate holder 4 in the region of the substrate holding surface 4a.

Fixing by the substrate fixing means 6 or the carrier substrate fixing means 7 can alternatively take place by electrostatic fixing or by mechanical clamping.

The guide carriage 8 and thus the substrate holder 4 can be moved orthogonally to the holding surface 5a or to the substrate holding surface 4a by a Z-guide carriage 12 which is located orthogonally to the guide carriage 8 with a linear drive. The Z-guide carriage 12 is used as a raising means for raising the substrate 1 which is connected to the carrier substrate 2.

The substrate 1 is connected to the carrier substrate 2 by an interconnect layer 3, for example a thermoplastic cement. The arrangement of the substrate 1 and of the carrier substrate 2 and thus the substrate holder 4 and the carrier substrate holder 5 can also be reversed, i.e. turned by 180°.

In the process step shown in FIG. 1, the holding of the substrate-carrier substrate combination which consists of the substrate 1, the interconnect layer 3 and the carrier substrate 2 by the substrate holder 4 and the carrier substrate holder 5 is shown. Perfectly parallel alignment of the substrate holder 4 or of the substrate holding surface 4a relative to the carrier substrate holder 5 or the holding surface 5a is of special importance.

Figure 2:
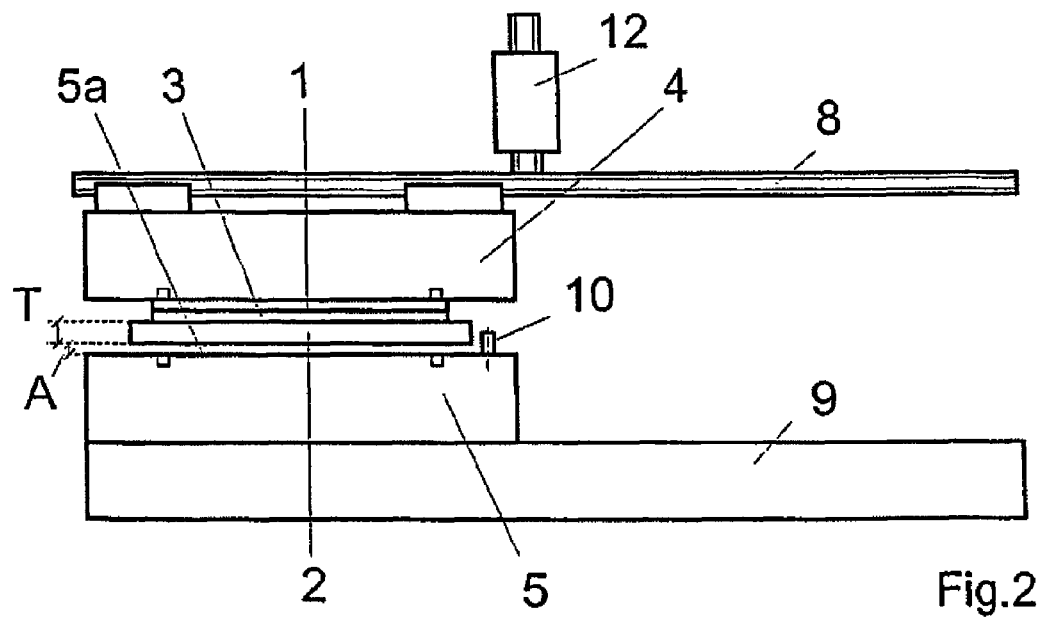
FIG. 2 shows a schematic side view of the device as claimed in the invention in a second process step.

Then the substrate-carrier substrate combination as shown in FIG. 2 is slightly raised by the guide carriage 12, exactly orthogonally to the holding surface 5a, so that in the subsequent parallel displacement as shown in FIGS. 3 and 4 there is no contact between the holding surface 5a and the carrier substrate 2. The carrier substrate 2 is advantageously raised by a raising height A of less than the height T of the carrier substrate.

Following the raising as shown in FIG. 2 or during the raising as shown in FIG. 2, the connecting force which is caused by the interconnect layer 3 between the substrate 1 and the carrier substrate 2 is reduced by means for reducing the connecting force, for example by temperature action.

In the process step as shown in FIG. 3, parallel displacement of the substrate 1 along the guide carriage 8 which is caused by a linear motor (not shown) takes place. Until the carrier substrate 2 strikes the holding means 10 which are made as pins, there is still no relative motion between the substrate 1 and the carrier substrate 2. As soon as the carrier substrate 2 strikes the pin or pins, the substrate 1 begins to be separated from the carrier substrate 2 by parallel displacement of the substrate 1 relative to the carrier substrate 2. Aside from the force of gravity acting on the carrier substrate 2 by the weight of the carrier substrate 2, during parallel displacement transverse forces are not acting so that damage of the sensitive substrate 1 which is moreover protected by the substrate holder 4 is more or less precluded.

In FIG. 4 the separation process is completed, the separation process not having to consist solely, but only predominantly, of parallel displacement, since the adhesive force caused by the interconnect layer 3 between the substrate 1 and the carrier substrate 3 during the separation process continuously decreased and towards the end of the separation process displacement in the orthogonal direction can take place in addition to the parallel displacement. To the extent the carrier substrate 2 however is to be deposited in the position as shown in FIG. 4 after the separation process, it is advantageous to effect the separation process completely by parallel displacement. Alternatively, the carrier substrate 2 can be peeled off the substrate towards the end of the separating process by the fixing means 7 which are made as vacuum grooves.

Description of the Reference Numerals
1 substrate
2 carrier substrate
3 interconnect layer
4 substrate holder
4a substrate holding surface
5 carrier substrate holder
5a holding surface
6 substrate fixing means
7 carrier substrate fixing means
8 guide carriage
9 base plate
10 holding means
12 Z-guide carriage Having described the invention, the following is claimed:

1. Method for separating a substrate from a carrier substrate, wherein the carrier substrate is connected to the substrate by an interconnect layer, said method including the following steps:
   holding a substrate-carrier substrate combination, which consists of the carrier substrate, the interconnect layer and the substrate, between a substrate holding surface of a substrate holder and a holding surface of a carrier substrate holder, wherein the holding surface of the carrier substrate holder is capable of being located parallel to the substrate holding surface of the substrate holder, and
   separating the substrate from the carrier substrate by parallel displacement of the substrate relative to the carrier substrate in an interconnected state of the substrate and the carrier substrate,
   wherein the step of separating the substrate from the carrier substrate includes providing a dynamometric means for measuring a stripping force between the substrate and the carrier substrate, wherein a speed of parallel displacement of the substrate relative to the carrier substrate is adjusted based on the stripping force measured by the dynamometric means.

2. Method as claimed in claim 1, wherein a connecting force caused by the interconnect layer is reduced after the holding step and prior to the separating step.

3. Method as claimed in claim 1 wherein the method is performed by a device further comprising:
   a carrier substrate holder with a holding surface for holding the carrier substrate, and
   a substrate holder which is located opposite the carrier substrate holder with a substrate holding surface for holding the substrate wherein the substrate holding surface of the substrate holder is capable of being located parallel to the holding surface of the carrier substrate holder,
   wherein there are separating means for parallel displacement of the substrate relative to the carrier substrate when the substrate is connected to the carrier substrate.

4. Method as claimed in claim 1, wherein the separating step is performed by a guide carriage for parallel displacement of the substrate relative to the carrier substrate, the guide carriage having a linear drive.

5. Method as claimed in claim 4, further comprising a drive control for controlling a speed at which the substrate is separated from the carrier substrate, wherein the speed increases during the separation step based on the stripping force.

6. Method as claimed in claim 1, wherein before the separating step the carrier substrate is removed from the carrier substrate holder and the substrate-carrier substrate combination is oriented in a raised position.

7. Method as claimed in claim 1, wherein the substrate is separated from the carrier substrate by parallel displacement.

* * * * *